(12) United States Patent
Koga

(10) Patent No.: US 6,236,248 B1
(45) Date of Patent: May 22, 2001

(54) OUTPUT BUFFER CIRCUIT

(75) Inventor: Hiroki Koga, Kangawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/425,806

(22) Filed: Oct. 22, 1999

(30) Foreign Application Priority Data

Oct. 22, 1998 (JP) ................................. 10-301503

(51) Int. Cl.$^7$ ................................ H03B 1/00; H03K 3/00
(52) U.S. Cl. ......................... 327/112; 327/310; 327/312; 326/27; 326/83
(58) Field of Search .......................... 327/108–112, 170, 327/309, 312, 313, 321, 318, 310, 374–377, 379–382, 384, 387, 390, 391; 326/121, 83, 86, 87, 17, 26, 27

(56) References Cited

U.S. PATENT DOCUMENTS

| | | | | |
|---|---|---|---|---|
| 4,527,077 | * | 7/1985 | Higuchi et al. | 327/170 |
| 5,293,082 | * | 3/1994 | Bathaee | 327/170 |
| 5,317,206 | * | 5/1994 | Hanibuchi et al. | 327/170 |
| 6,060,938 | * | 5/2000 | Morrill | 327/391 |
| 6,087,885 | * | 7/2000 | Tobia | 327/379 |

FOREIGN PATENT DOCUMENTS 9-093111   4/1997   (JP) .
9-148909   6/1997   (JP) .

* cited by examiner

Primary Examiner—Terry D. Cunningham
Assistant Examiner—Long Nguyen
(74) Attorney, Agent, or Firm—Hayes, Soloway, Hennessey Grossman & Hage, P.C.

(57) ABSTRACT

An output buffer circuit is provided, which decreases a delay time of change of a digital output signal with respect to change of a digital input signal and which is capable of higher-speed switching operation. This output buffer circuit is comprised of a pair of a first p-channel MOSFET and a first n-channel MOSFET located in an output stage through which an output signal is derived; a first clamp circuit for clamping a gate voltage of the first p-channel MOSFET at a first clamp level for a first specific period, thereby increasing a rising rate of the output signal; and a second clamp circuit for clamping a gate voltage of the first n-channel MOSFET at a second clamp level for a second specific period, thereby increasing a falling rate of the output signal. A first resistor is connected to the first clamp circuit for suppressing a current flowing through the first clamp circuit. A second resistor is connected to the second clamp circuit for suppressing a current flowing through the second clamp circuit. A first capacitor is connected to the first clamp circuit for adjusting the gate voltage of the first p-channel MOSFET through its charging or discharging operation. A second capacitor is connected to the second clamp circuit for adjusting the gate voltage of the first n-channel MOSFET through its charging or discharging operation.

9 Claims, 5 Drawing Sheets

OUTPUT BUFFER CIRCUIT

BACKGROUND OF THE INVENTION

1. Field of the Invention

The present invention relates to an output buffer circuit for digital signals and more particularly, to an output buffer circuit having a pair of p- and n-channel Metal-Oxide-Semiconductor Field-Effect Transistors (MOSFETs) in its output stage, which suppresses a peak current flowing through the pair of MOSFETs and operates at high switching rate.

2. Description of the Prior Art

Input and output buffer circuits have been popularly used in Very Large Scale Integrated circuits (VLSIs) for exchanging digital signals with respect to their outside circuitry.

An output buffer circuit receives a digital input signal and outputs a digital output signal for driving its external load, thereby setting the logic state of the external load at a logic low (L) level or a logic high (H) level according to the logic state of the applied input signal. When the output signals of a plurality of output buffer circuits in a VLSI are simultaneously switched to the same logic level L or H, the magnitude of the power supply current flowing through the VLSI changes largely and rapidly, resulting in noise in the VLSI due to the transient phenomena of the currents and/or voltages. This noise tends to cause malfunction of other circuits connected to the same power supply as that of the output buffer circuit, such as input buffer circuits. Therefore, to prevent this malfunction problem from occurring, a solution that the slew rate (i.e., the maximum rate of change with respect to an applied square or stepped wave) of the output signal of the output buffer circuit is suitably adjusted has been developed and practically used.

On the other hand, it is needless to say that output buffer circuits of this sort are required to operate or switched as fast as possible.

An example of prior-art output buffer circuits of this sort is disclosed in the Japanese Non-Examined Patent Publication No. 9-148909 published in June 1997, in which the control voltages applied to the gates of MOSFETs located in the output stage are adjusted to change rapidly and then, to change slowly at each switching operation of the MOSFETs.

FIG. 1 shows the circuit configuration of the prior-art output buffer circuit disclosed in the Japanese Non-Examined Patent Publication No. 9-148909.

As shown in FIG. 1, this prior-art output buffer circuit is comprised of p- and n-channel output MOSFETs M130 and M140, first and second threshold detection circuits T131, and T132, first and second switches S101 and S102, first and second resistors R131 and R141, p- and n-channel MOSFETs M131 and M132 forming a first Complementary MOS (CMOS) inverter, p- and n-channel MOSFETs M141 and M142 forming a second CMOS inverter, and input and output terminals 102 and 103. A digital input signal $D_{IN}$ is applied to the input terminal 102 and a digital output signal $D_{OUT}$ having the same logic state as that of the input signal $D_{IN}$ is derived from the output terminal 103. The reference symbol $V_{CC}$ denotes a power supply voltage.

The first and second CMOS inverters formed by the MOSFETs M131, M132, M141, and M142 constitute a previous stage 101 for inverting the input signal $D_{IN}$ and outputting an inverted one of the input signal $D_{IN}$. The p- and n-channel output MOSFETs M130 and M140 constitute a CMOS output stage 104 for inverting the inverted signal from the previous stage 101 and outputting the digital output signal $D_{OUT}$ having the same logic state as that of the input signal $D_{IN}$.

The first resistor R131, the first switch circuit S101, and the first threshold detection circuit T131 constitute a first slew-rate control circuit for controlling the changing rate of the gate voltage $V_{G130}$ of the p-channel MOSFET M130 in the output stage 104. The first resistor R131 suppresses the rate of falling behavior from the logic H state to the logic L state of the gate voltage $V_{G130}$ (i.e., the pull-down operation of the MOSFET M130). The first switch S101 forms a bypass of the first resistor R131, which is turned on or off under the control of the first threshold detection circuit T131. The first threshold detection circuit T131 detects whether the gate voltage $V_{G130}$ of the p-channel MOSFET M130 is equal to or lower than the threshold voltage $V_{THP}$ at which the MOSFET M130 is switched from the OFF state to the ON state. Thus, when the gate voltage $V_{G130}$ of the p-channel MOSFET M130 is equal to or lower than the threshold voltage $V_{THP}$, the first threshold detection circuit T131 turns the first switch S101 off. When the gate voltage $V_{G130}$ of the p-channel MOSFET M130 is higher than the threshold voltage $V_{THP}$, the first threshold detection circuit T131 turns the first switch S101 on.

The second resistor R141, the second switch circuit S102, and the second threshold detection circuit T141 constitute a second slew-rate control circuit for controlling the changing rate of the gate voltage $V_{G140}$ of the n-channel MOSFET M140 in the output stage 104. The second resistor R141 suppresses the rate of rising behavior from the logic L state to the logic H state of the gate voltage $V_{G140}$ (i.e., the pull-up operation of the MOSFET M140). The second switch S102 forms a bypass of the second resistor R141, which is turned on or off under the control of the second threshold detection circuit T141. The second threshold detection circuit T141 detects whether the gate voltage $V_{G140}$ of the n-channel MOSFET M140 is equal to or higher than the threshold voltage $V_{THN}$ at which the MOSFET M140 is switched from the OFF state to the ON state. Thus, when the gate voltage $V_{G140}$ of the n-channel MOSFET M140 is equal to or higher than the threshold voltage $V_{THN}$, the second threshold detection circuit T141 turns the second switch S102 off. When the gate voltage $V_{G140}$ of the n-channel MOSFET M140 is lower than the threshold voltage $V_{THN}$, the second threshold detection circuit T141 turns the second switch S102 on.

The prior-art output buffer circuit shown in FIG. 1 operates in the following way:

When the input signal $D_{IN}$ applied to the input terminal 102 is changed from the logic L state to the logic H state, the gate voltages $V_{G130}$ and $V_{G140}$ of the MOSFETs M130 and M140 in the output stage 104 are pulled down by the first and second CMOS inverters formed by the MOSFETs M131 and M132 and M141 and M142 in the previous stage 101, respectively. In this case, the p-channel MOSFET M130 is switched from the OFF state to the ON state, because the decreased (i.e., pulled-down) gate voltage $V_{G130}$ of the MOSFET M130 becomes lower than its threshold voltage $V_{THP}$. During this switching operation of the MOSFET M130, the first switch S101 is switched from the ON state to the OFF state by the first threshold detection circuit T131 at the time when the gate voltage $V_{G130}$ of the MOSFET M130 is lowered to be equal to the threshold voltage $V_{THP}$, thereby inserting the first resistor R131 into the path connecting the drains of the MOSFETs M131 and M132 of the first CMOS inverter. Thus, the decreasing rate of the threshold voltage $V_{THP}$ is suppressed.

As a result, when the input signal $D_{IN}$ is changed from the logic L state to the logic H state, the decreasing rate of the gate voltage $V_{G130}$ of the MOSFET M130 is relatively higher until the gate voltage $V_{G130}$ is lowered to be equal to the threshold voltage $V_{THP}$, and is relatively lower after the gate voltage $V_{G130}$ is lower than the threshold voltage $V_{THP}$.

On the other hand, the n-channel MOSFET M140 in the output stage 104 is switched from the ON state to the OFF state, because the decreased (i.e., pulled-down) gate voltage $V_{G140}$ of the MOSFET M140 becomes lower than its threshold voltage $V_{THN}$. During this switching operation, the second switch S102 is kept in the ON state and accordingly, the drains of the MOSFETs M141 and M142 of the second CMOS inverter are directly connected to each other through the second switch S102. Thus, the decreasing rate of the threshold voltage $V_{THN}$ is not suppressed.

As a result, when the input signal $D_{IN}$ is changed from the logic L state to the logic H state, the decreasing rate of the gate voltage $V_{G140}$ of the MOSFET M140 is kept high.

Because of the above-explained reason, the rising delay time of the output signal $D_{OUT}$, which is defined as a delay from the time at which the input signal $D_{IN}$ is switched from the logic L state to the logic H state to the time at which the output signal $D_{OUT}$ begins to rise, can be shortened. Also, the rising slew-rate of the output signal $D_{OUT}$ can be suppressed.

Next, when the input signal $D_{IN}$ is changed from the logic H state to the logic L state, the gate voltages $V_{G130}$ and $V_{G140}$ of the MOSFETs M130 and M140 in the output stage 104 are pulled up by the first and second CMOS inverters in the previous stage 101, respectively. In this case, the n-channel MOSFET M140 is switched from the OFF state to be ON state because the increased (i.e., pulled-up) gate voltage $V_{G140}$ of the MOSFET M140 becomes higher than its threshold voltage $V_{THN}$. At this time, the second switch S102 is switched from the ON state to the OFF state when the gate voltage $V_{G140}$ of the MOSFET M140 is raised to be equal to the threshold voltage $V_{THN}$ due to the operation of the second threshold detection circuit T141, thereby inserting the second resistor R141 into the path connecting the drains of the MOSFETs M141 and M142 of the second CMOS inverter. Thus, the increasing rate of the threshold voltage $V_{THN}$ is suppressed.

As a result, when the input signal $D_{IN}$ is changed from the logic H state to the logic L state, the changing rate of the gate voltage $V_{G140}$ of the MOSFET M140 is relatively higher until the gate voltage $V_{G140}$ is raised to be equal to the threshold voltage $V_{THN}$, and is relatively lower after the gate voltage $V_{G140}$ is higher than the threshold voltage $V_{THN}$.

On the other hand, the p-channel MOSFET M130 in the output stage 104 is switched from the ON state to the OFF state because the increased (i.e., pulled-up) gate voltage $V_{G130}$ of the MOSFET M130 becomes higher than its threshold voltage $V_{THP}$. During this switching operation, the first switch S101 is kept in the ON state and accordingly, the drains of the MOSFETs M131 and M132 of the first CMOS inverter are directly connected to each other through the fist switch S101. Thus, the increasing rate of the threshold voltage $V_{THP}$ is not suppressed.

As a result, when the input signal $D_{IN}$ is changed from the logic H state to the logic L state, the changing rate of the gate voltage $V_{G130}$ of the MOSFET M130 is kept high.

Because of the above-explained reason, the falling delay time of the output signal $D_{OUT}$, which is defined as a delay from the time at which the input signal $D_{IN}$ is switched from the logic H state to the logic L state to the time at which the output signal $D_{OUT}$ begins to fall, can be shortened. Also, the falling slew-rate of the output signal $D_{OUT}$ can be suppressed.

As described above, the rising and falling slew-rates of the output signal $D_{OUT}$ can be shortened while suppressing the rapid change of the power supply current. This prevents the malfunction of the VLSI including the prior-art output buffer circuit shown in FIG. 1.

With the prior-art output buffer circuit disclosed in the Japanese Non-Examined Patent Publication No. 9-148909, which is shown in FIG. 1, when the input signal $D_{IN}$ is changed from the logic L state to the logic H state, the changing rate of the gate voltage $V_{G130}$ of the MOSFET M130 is relatively higher until the gate voltage $V_{G130}$ is lowered to be equal to the threshold voltage $V_{THP}$. However, it is lowered after the gate voltage $V_{G130}$ is lower than the threshold voltage $V_{THP}$. On the other hand, when the input signal $D_{IN}$ is changed from the logic H state to the logic L state, the changing rate of the gate voltage $V_{G140}$ of the MOSFET M140 is relatively higher until the gate voltage $V_{G140}$ is raised to be equal to the threshold voltage $V_{THN}$. However, it is lowered after the gate voltage $V_{G140}$ is higher than the threshold voltage $V_{THN}$. Therefore, there is a problem that the effect to decrease the delay time of the change of the output signal $D_{OUT}$ with respect to the change of the input signal $D_{IN}$ is insufficient.

Moreover, the gate voltage $V_{G130}$ of the MOSFET M130 varies even after it is lowered to the threshold voltage $V_{THP}$ and the gate voltage $V_{G140}$ of the MOSFET M140 varies even after the gate voltage $V_{G140}$ is raised to the threshold voltage $V_{THN}$. Therefore, there is another problem that the peak current flowing through the MOSFETs M130 and M140 in the output stage 104 cannot be satisfactorily decreased.

Another example of the prior-art output buffer circuits of the sort is disclosed in the Japanese Non-Examined Patent Publication No. 9-93111 published in April 1997.

The prior-art output buffer circuit disclosed in the Japanese Non-Examined Patent Publication No. 9-93111 is comprised of a p-channel MOSFET and an n-channel MOSFET located in an output stage, and first and second slew-rate circuits located in a previous stage to the output stage.

The source and drain of the p-channel MOSFET in the output stage are connected to the power supply node applied with a power supply voltage $V_{CC}$ and the output node. The source and drain of the n-channel MOSFET in the output stage are connected to the output node and the ground node. Therefore, the connection of these two MOSFETs is the same as that of the MOSFETs M130 and M140 shown in FIG. 1.

The first slew-rate circuit includes MOSFETs that are switched by a digital input signal applied to the prior-art output buffer circuit and by a digital feedback signal fed-back from the output stage. The first slew-rate circuit has an input-output characteristic that the output changing rate at the time when the input signal is switched from the logic L state to the logic H state is higher than that at the time when the input signal is switched from the logic H state to the logic L state. The output of the first slew-rate circuit is applied to the gate of the n-channel MOSFET in the output stage, thereby controlling the gate voltage of this n-channel MOSFET.

Similarly, the second slew-rate circuit includes MOSFETs that are switched by the digital input signal applied into the prior-art output buffer circuit and by the digital feedback signal fed-back from the output stage. The second slew-rate circuit has an input-output characteristic that the output changing rate at the time when the input signal is switched from the logic L state to the logic H state is lower than that at the time when the input signal is switched from the logic H state to the logic L state. The output of the second slew-rate circuit is applied to the gate of the p-channel MOSFET in the output stage, thereby controlling the gate voltage of this p-channel MOSFET.

Thus, due to the input-output characteristics of the first and second slew-rate circuits, the gate voltages of the n- and p-channel MOSFETs in the output stage can be raised from the ground level to the intermediate level of ($V_{CC}/2$) at a relatively higher rate and then, it can be raised from the intermediate level of $V_{CC}/2$) to the highest level of $V_{CC}$ at a relatively lower rate. Similarly, the gate voltages of the p- and n-channel MOSFETs in the output stage can be lowered from the highest level of $V_{CC}$ to the intermediate level of ($V_{CC}/2$) at a relatively higher rate and then, it can be lowered from the intermediate level of ($V_{CC}/2$) to the ground level at a relatively lower rate. Accordingly, the delay of change of the output signal with respect to that of the input signal can be suppressed and at the same time, the peak value of the output current can be lowered.

Also, because the MOSFETs in the first and second slew-rate circuits are switched by using the digital feedback signal (i.e., the input signal) from the output stage, the characteristic fluctuation of the prior-art output buffer circuit due to the threshold voltage fluctuation occurring in the fabrication processes can be suppressed.

With the prior-art output buffer circuit disclosed in the Japanese Non-Examined Patent Publication No. 9-93111, however, due to the input-output characteristic of the first slew-rate circuit, the gate voltages of the n- and p-channel MOSFETs in the output stage are further raised to the highest level of $V_{CC}$ at a relatively lower rate even after they become equal to the intermediate level of ($V_{CC}/2$). Also, they are further lowered to the ground level at a relatively lower rate even after they become equal to the intermediate level of ($V_{CC}/2$). Therefore, there is a problem that the peak current flowing through the MOSFETs in the output stage cannot be satisfactorily decreased.

Moreover, since a time delay of the output signal occurs when the changing rate of the gate voltages of the n- and p-channel MOSFETs in the output stage is switched, there is another problem that the effect to decrease the delay time of the change of the output signal with respect to the change of the input signal is insufficient.

SUMMARY OF THE INVENTION

Accordingly, an object of the present invention to provide an output buffer circuit that decreases a delay time of change of a digital output signal with respect to change of a digital input signal.

Another object of the present invention to provide an output buffer circuit capable of higher-speed switching operation.

Still another object of the present invention to provide an output buffer circuit that decreases a peak current flowing through MOSFETs in an output stage during the switching behavior of the MOSFETs.

The above objects together with others not specifically mentioned will become clear to those skilled in the art from the following description.

An output buffer circuit according to the present invention is comprised of an input terminal to which a digital input signal is applied; an output terminal from which a digital output signal is derived according to the applied digital input signal; a pair of a first p-channel MOSFET and a first n-channel MOSFET located in an output stage through which the output signal is derived; a first clamp circuit for clamping a gate voltage of the first p-channel MOSFET at a first clamp level; a second clamp circuit for clamping a gate voltage of the first n-channel MOSFET at a second clamp level; a first resistor connected to the first clamp circuit for suppressing a current flowing through the first clamp circuit; a second resistor connected to the second clamp circuit for suppressing a current flowing through the second clamp circuit; a first capacitor connected to the first clamp circuit for adjusting the gate voltage of the first p-channel MOSFET through its charging or discharging operation; and a second capacitor connected to the second clamp circuit for adjusting the gate voltage of the first n-channel MOSFET through its charging or discharging operation.

The first clamp circuit clamps the gate voltage of the first p-channel MOSFET at the first clamp level for a first specific period, thereby increasing a rising rate of the output signal. The second clamp circuit clamps the gate voltage of the first n-channel MOSFET at the second clamp level for a second specific period, thereby increasing a falling rate of the output signal.

With the output buffer circuit according to the present invention, the first clamp circuit is provided to clamp the gate voltage of the first p-channel MOSFET at the first clamp level for a first specific period, thereby increasing a rising rate of the output signal, and at the same time, the second clamp circuit is provided to clamp the gate voltage of the first n-channel MOSFET at the second clamp level for a second specific period, thereby increasing a falling rate of the output signal. Also, the first and second capacitors are connected respectively to the first and second clamp circuits for adjusting the gate voltages of the first p- and n-channel MOSFETs through their charging or discharging operation.

Therefore, the gate voltages of the first p-channel MOSFET and the first n-channel MOSFET in the output stage can be rapidly changed due to the charging or discharging operation of the first and second capacitors in response to the change of the input signal. As a result, a delay time of change of the output signal with respect to change of the input signal can be decreased, which makes it possible to realize a higher-speed switching operation.

Moreover, since the switching operation of the first p- and n-channel MOSFETs in the output stage are clamped for the first and second clamp periods by the first and second clamp circuits, respectively, the penetrating current through the first p- and n-channel MOSFETs can be fixed at a low value. As a result, the peak current flowing through first p- and n-channel MOSFETs in the output stage can be decreased during their switching behaviors.

Additionally, the effect caused by the first and second clamp circuits can be prevented from being applied to the operation of the output buffer circuit according to the present invention. This is because the currents flowing through the first and second clamps circuits can be suppressed.

In a preferred embodiment of the output buffer circuit according to the present invention, the first resistor and the first capacitor are connected in parallel for the first clamp circuit, and electric charges stored in the first capacitor are charged or discharge through the first resistor. The second resistor and the second capacitor are connected in parallel for the second clamp circuit, and electric charges stored in the second capacitor are charged or discharge through the second resistor.

In another preferred embodiment of the output buffer circuit according to the present invention, the first clamp circuit includes a first switch operated by the input voltage and a second switch operated by the output voltage, and the second clamp circuit includes a third switch operated by the input voltage and a fourth switch operated by the output voltage. The first and second switches serve to activate or inactivate the first clamp circuit. The third and fourth switches serve to activate or inactivate the second clamp circuit.

In still another preferred embodiment of the output buffer circuit according to the present invention, the first clamp circuit includes second and third p-channel MOSFETs connected in series, and the second clamp circuit includes second and third n-channel MOSFETs connected in series.

In a further preferred embodiment of the output buffer circuit according to the present invention, a first inverter and a second inverter are additionally provided. The first inverter serves to invert the input signal to output an inverted signal to the gate of the first p-channel MOSFET. The second inverter serves to invert the input signal to output an inverted signal to the gate of the first n-channel MOSFET.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
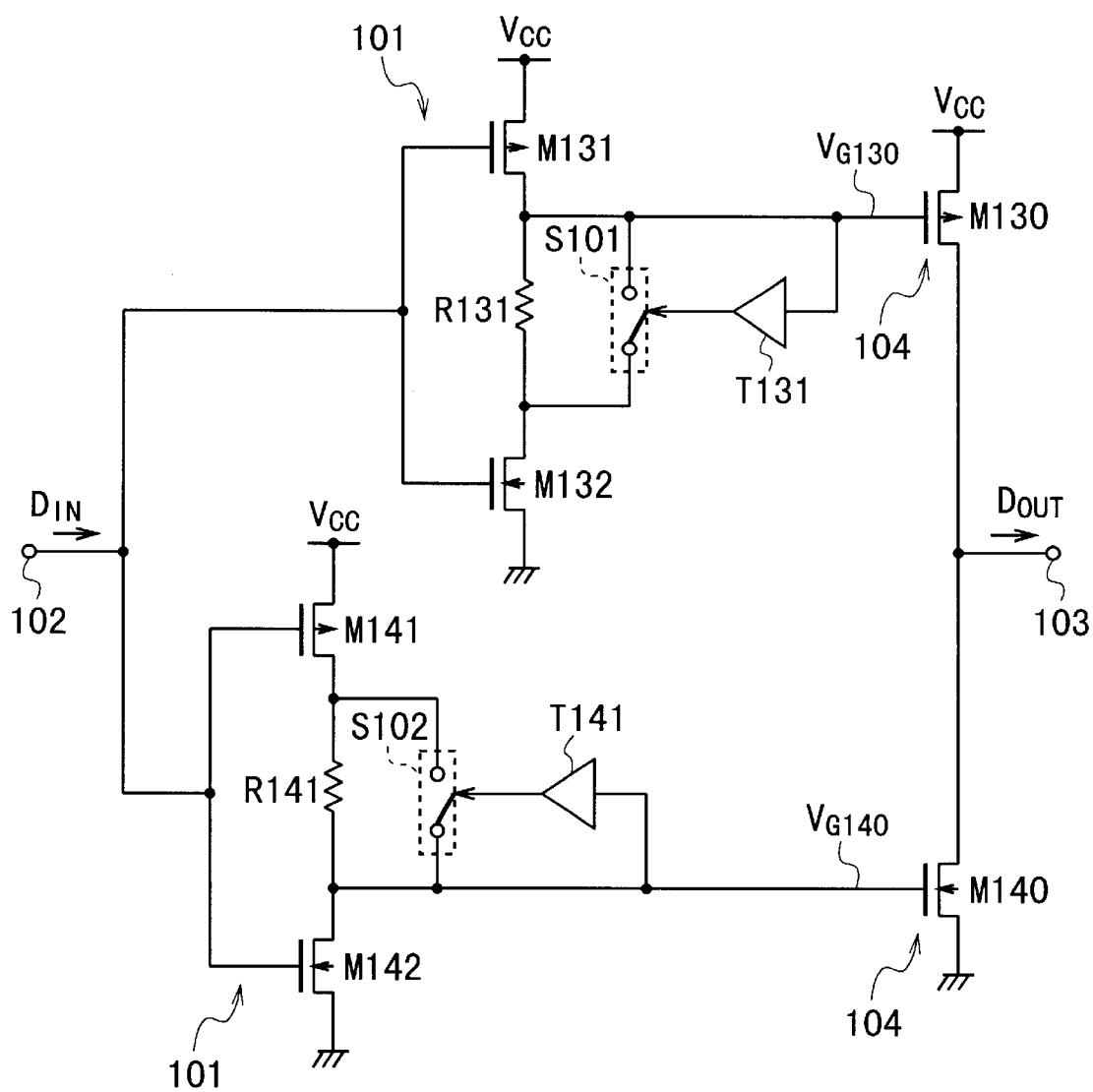
FIG. 1 is a circuit diagram showing the configuration of an example of the prior-art output buffer circuits.

Preferred embodiments of the present invention will be described in detail below while referring to the drawings attached.

First Embodiment

Figure 2:
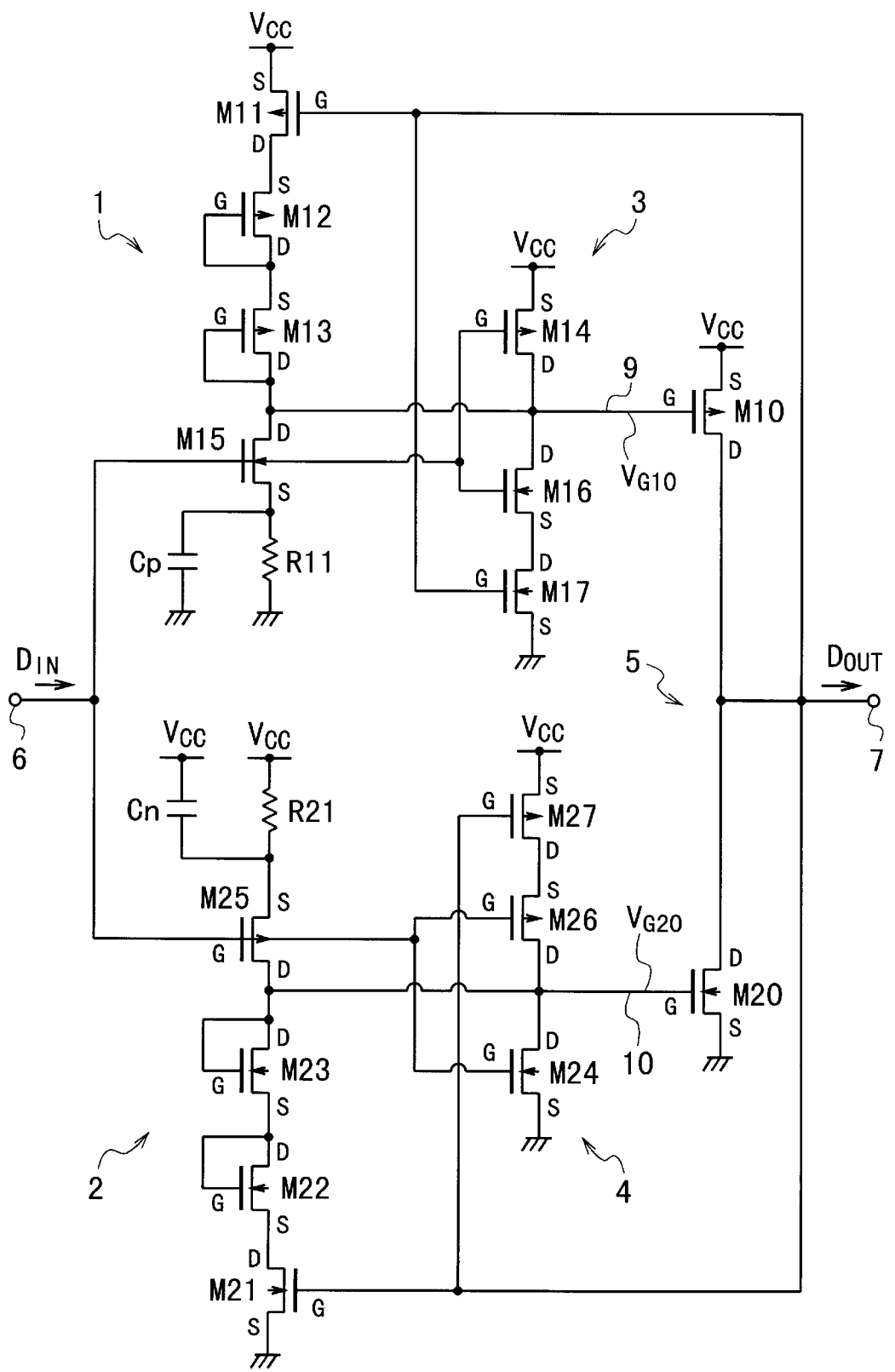
FIG. 2 is a circuit diagram showing the configuration of an output buffer circuit according to a first embodiment of the present invention.

As shown in FIG. 2, an output buffer circuit according to a first embodiment of the present invention is comprised of a first clamp circuit 1, a second clamp circuit 2, a first inverter 3, a second inverter 4, an output stage 5, an input terminal 6, and an output terminal 7. A digital input signal $D_{IN}$ is applied to the input terminal 6 and a digital output signal $D_{OUT}$ is derived from the output terminal 7.

The output stage 5 includes a p-channel MOSFET M10 and an n-channel MOSFET M20 whose drains are coupled together to be connected to the output terminal 7. The source of the p-channel MOSFET M10 is connected to a power supply (not shown) having a supply voltage of $V_{CC}$. The source of the n-channel MOSFET M20 is connected to the ground. The MOSFETs M10 and M20 are switched between the logic H state and the logic L state according to their gate voltages $V_{G10}$ and $V_{G20}$, respectively. The output stage 5 produces the output signal $D_{OUT}$ having the same logic state H or L as that of the input signal $D_{IN}$.

The first inverter 3 is formed by a p-channel MOSFET M14 and an n-channel MOSFET M16 whose drains are coupled together to be connected to the gate of the p-channel MOSFET M10 in the output stage 5. The source of the p-channel MOSFET M14 is connected directly to the power supply having the supply voltage of $V_{CC}$. The source of the n-channel MOSFET M16 is connected to the ground through an n-channel MOSFET M17. The output signal $D_{OUT}$ is fed back to the gate of the MOSFET M17. Therefore, the first inverter 3 is controlled to be active or inactive by the output signal $D_{OUT}$. Specifically, when the output signal $D_{OUT}$ is in the logic L state, the MOSFET M17 is in the OFF state and the first inverter 3 is kept inactive. Also, when the output signal $D_{OUT}$ is in the logic H state, the MOSFET M17 is in the ON state and the first inverter 3 is kept active. When the input signal $D_{IN}$ is switched from the logic L state to the logic H state, the first inverter 3 is kept inactive. The first inverter 3 outputs an output signal having an opposite logic state H or L to that of the input signal $D_{IN}$ at its output node (i.e., the coupled drains of the MOSFETs M14 and M16), which is applied to the gate of the MOSFET M10.

The second inverter 4 is formed by a p-channel MOSFET M26 and an n-channel MOSFET M24 whose drains are coupled together to be connected to the gate of the n-channel MOSFET M20 in the output stage 5. The source of the p-channel MOSFET M26 is connected to the power supply of $V_{CC}$ through a p-channel MOSFET M27. The source of the n-channel MOSFET M24 is connected directly to the ground. The output signal $D_{OUT}$ is fed back to the gate of the MOSFET M27. Therefore, the second inverter 4 is controlled to be active or inactive by the output signal $D_{OUT}$. Specifically, when the output signal $D_{OUT}$ is in the logic L state, the MOSFET M27 is in the ON state and the second inverter 4 is kept active. Also, when the output signal $D_{OUT}$ is in the logic H state, the MOSFET M27 is in the OFF state and the second inverter 4 is kept inactive. When the input signal $D_{IN}$ is switched from the logic H state to the logic L state, the second inverter 4 is kept inactive. The second inverter 4 outputs an output signal having an opposite logic state H or L to that of the input signal $D_{IN}$ at its output node (i.e., the coupled drains of the MOSFETs M24 and M26), which is applied to the gate of the MOSFET M20.

The first clamp circuit 1 includes two p-channel MOSFETs M12 and M13 and a resistor R11. The drain and gate of the MOSFET M12 are coupled together and the drain and gate of the MOSFET M13 are coupled together. In other words, each of the MOSFETs M12 and M13 has a diode connection. The source of the MOSFET M12 is connected to the power supply of $V_{CC}$ through a p-channel MOSFET M11. The gate of the MOSFET M11 is connected the output terminal 7 and the gate of the MOSFET M17, which is applied with the output signal $D_{OUT}$. The source of the MOSFET M13 is connected to the coupled drain and gate of the MOSFET M12. The coupled drain and gate of the MOSFET M13 are connected to the ground through an n-channel MOSFET M15 and the resistor R11. The gate of the MOSFET M15 is connected to the input terminal 6 and the coupled gates of the MOSFETs M14 and M16 of the first inverter 3, which is applied with the input signal $D_{IN}$.

The first clamp circuit 1 serves to clamp the gate voltage $V_{G10}$ of the MOSFET M10 in the output stage 5 at a first clamp voltage $V_{CLAMP1}$ for a specific period. The first clamp circuit 1 is controlled to be active or inactive by the input and output signals $D_{IN}$ and $D_{OUT}$. When the input signal $D_{IN}$ is switched from the logic H state to the logic L state, the first clamp circuit 1 is kept inactive by the turned-off MOSFET M11 and as a result, the output signal (which has an opposite logic state to that of the input signal $D_{IN}$) of the first inverter 3 is directly applied to the gate of the MOSFET M10.

A capacitor Cp is connected in parallel to the resistor R11 between the ground and the source of the MOSFET M15.

The capacitor Cp is used to shorten the time period required for the gate voltage $V_{G10}$ of the MOSFET M10 reaching the first clamp voltage $V_{CLAMP1}$ due to its charging operation.

The second clamp circuit 2 includes two n-channel MOSFETs M23 and M22 and a resistor R21. The drain and gate of the MOSFET M23 are coupled together and the drain and gate of the MOSFET M22 are coupled together. In other words, each of the MOSFETs M23 and M22 has a diode connection. The source of the MOSFET M22 is connected to the ground through an n-channel MOSFET M21. The gate of the MOSFET M21 is connected the output terminal 7 and the gate of the MOSFET M27, which is applied with the output signal $D_{OUT}$. The source of the MOSFET M23 is connected to the coupled drain and gate of the MOSFET M22. The coupled drain and gate of the MOSFET M23 are connected to the power supply of $V_{CC}$ through a p-channel MOSFET M25 and the resistor R21. The gate of the MOSFET M25 is connected the input terminal 6 and the coupled gates of the MOSFETs M24 and M26 of the second inverter 4, which is applied with the input signal $D_{IN}$.

The second clamp circuit 2 serves to clamp the gate voltage $V_{G20}$ of the MOSFET M20 in the output stage 5 at a second clamp voltage $V_{CLAMP2}$ for a specific period. The second clamp circuit 2 is controlled to be active or inactive by the input and output signals $D_{IN}$ and $D_{OUT}$. When the input signal $D_{IN}$ is switched from the logic L state to the logic H state, the second clamp circuit 2 is kept inactive by the turned-off MOSFET M21 and as a result, the output signal (which has an opposite logic state to that of the input signal $D_{IN}$) of the second inverter 4 is directly applied to the gate of the MOSFET M20.

A capacitor Cn is connected in parallel to the resistor R21 between the power supply of $V_{CC}$ and the source of the MOSFET M25. The capacitor Cn is used to shorten the time period required for the gate voltage $V_{G20}$ of the MOSFET M20 reaching the second clamp voltage $V_{CLAMP2}$ due to its discharging operation.

The p-channel MOSFET M11, which is provided for the first clamp circuit 1, serves as a first switch for switching the operation of the first clamp circuit 1 between the active and inactive states according to the output signal $D_{OUT}$. The n-channel MOSFET M15, which is also provided for the first clamp circuit 1, serves as a second switch for switching the operation of the first clamp circuit 1 between the active and inactive states according to the input signal $D_{IN}$.

The n-channel MOSFET M17, which is provided for the first inverter 3, serves as a third switch for switching the operation of the first inverter 3 between the active and inactive states according to the output signal $D_{OUT}$.

The n-channel MOSFET M21, which is provided for the second clamp circuit 2, serves as a fourth switch for switching the operation of the second clamp circuit 2 between the active and inactive states according to the output signal $D_{OUT}$. The p-channel MOSFET M25, which is also provided for the second clamp circuit 2, serves as a fifth switch for switching the operation of the second clamp circuit 2 between the active and inactive states according to the input signal $D_{IN}$.

The p-channel MOSFET M27, which is provided for the second inverter 4, serves as a sixth switch for switching the operation of the second inverter 4 between the active and inactive states according to the output signal $D_{OUT}$.

The capacitance value of the capacitor Cp is determined so that the electric charges stored in the parasitic capacitors in the p-channel MOSFETs M10, M13, and M14 and the n-channel MOSFETs M15 and M16 and the wiring line 9 connected to the gate of the MOSFET M10 can be discharged, thereby lowering the gate voltage $V_{G10}$ of the MOSFET M10 from the logic H voltage $V_H$ to the first clamp voltage $V_{CLAMP1}$ set by the first clamp circuit 1.

Here, the first clamp voltage $V_{CLAMP1}$ is expressed as an equation of $V_{CLAMP1}=V_{CC}-(2\times V_{tp}+\alpha_p)$, where $V_{tp}$ is the threshold voltage of a p-channel MOSFET and $\alpha_p$ is a parameter determined according to the characteristic or performance of a p-channel MOSFET. Here, $\alpha_p$ is equal to the sum of the voltage drops caused by the ON resistances of the serially-connected, p-channel MOSFETs M12 and M13 in the first clamp circuit 1.

The first clamp voltage $V_{CLAMP1}$ is equal to the source voltage of the MOSFET M13. This means that the voltage difference between the source of the MOSFET M12 and the drain of the MOSFET M13 is equal to $(2\times V_{tp}+\alpha_p)$, which enables the MOSFETs M12 and M13 to be kept in the ON state.

Concretely, the capacitance value $C_p$ of the capacitor Cp can be given by the following equation (1).

$$C_p = \frac{(C_{M10G}+C_{M13G}+C_{M13D}+C_{M14D}+C_{M15D}+C_{M16D})\times V_{CLAMP1}}{V_{PD0009}-V_{CLAMP1}} \quad (1)$$

$$= \frac{3\times 0.5}{3.0-0.5}$$

$$= 0.6\,(\text{pF})$$

In the equation (1), $C_{M10G}$ is the value of the gate parasitic capacitance of the p-channel MOSFET M10, $C_{M13G}$ is the value of the gate parasitic capacitance of the p-channel MOSFET M13, $C_{M13D}$ is the value of the drain parasitic capacitance of the p-channel MOSFET M13, $C_{M14D}$ is the value of the drain parasitic capacitance of the p-channel MOSFET M14, $C_{M15D}$ is the value of the drain parasitic capacitance of the n-channel MOSFET M15, and $C_{M16D}$ is the value of the drain parasitic capacitance of the n-channel MOSFET M16. Also, $V_{PD0009}$ is the voltage difference between the wiring line 9 and the terminal of the capacitor value $C_p$ on the negative-side power supply (i.e., the ground potential) when the MOSFET M16 is in the ON state.

If the sum of $C_{M10G}$, $C_{M13G}$, $C_{M13D}$, $C_{M14D}$, $C_{M15D}$, and $C_{M16D}$ is equal to 3 (pF), $V_{CLAMP1}$ is 0.5 (V), and $V_{PD0009}$ is 3 (V) (=$V_{CC}$), the capacitance Cp is given as 0.6 (pF) by the above equation (1).

Similarly, the capacitance value of the capacitor Cn is determined so that the electric charges stored in the parasitic capacitors in the n-channel MOSFETs M20, M23, and M24 and the p-channel MOSFETs M25 and M26 and the wiring line 10 connected to the gate of the MOSFET M20 can be discharged, thereby lowering the gate voltage $V_{G20}$ of the MOSFET M20 from the logic H voltage $V_H$ to the second clamp voltage $V_{CLAMP2}$ set by the second clamp circuit 2.

Here, the second clamp voltage $V_{CLAMP2}$ is expressed as an equation of $V_{CLAMP2}=V_{CC}-(2\times V_m+\alpha_n)$, where $V_m$ is the threshold voltage of an n-channel MOSFET and $\alpha_n$ is a parameter determined according to the characteristic or performance of an n-channel MOSFET. Here, $\alpha_n$ is equal to the sum of the voltage drops caused by the ON resistances of the serially-connected, n-channel MOSFETs M22 and M23 in the second clamp circuit 2.

The second clamp voltage $V_{CLAMP2}$ is equal to the source voltage of the MOSFET M23. This means that the voltage difference between the source of the MOSFET M22 and the drain of the MOSFET M23 is equal to $(2\times V_m+\alpha_n)$, which enables the MOSFETs M22 and M23 to be kept in the ON state.

Concretely, the capacitance value $C_n$ of the capacitor Cn can be given by the following equation (2).

$$C_n = \frac{(C_{M20G} + C_{M23G} + C_{M23D} + C_{M24D} + C_{M25D} + C_{M26D}) \times V_{CLAMP2}}{V_{PD0010} - V_{CLAMP2}} \quad (2)$$

$$= \frac{3 \times 0.5}{3.0 - 0.5}$$

$$= 0.6 \, (pF)$$

In the equation (2), $C_{M20G}$ is the value of the gate parasitic capacitance of the n-channel MOSFET M20, $C_{M23G}$ is the value of the gate parasitic capacitance of the n-channel MOSFET M23, $C_{M23D}$ is the value of the drain parasitic capacitance of the n-channel MOSFET M23, $C_{M24D}$ is the value of the drain parasitic capacitance of the n-channel MOSFET M24, $C_{M25D}$ is the value of the drain parasitic capacitance of the p-channel MOSFET M25, and $C_{M26D}$ if the value of the drain parasitic capacitance of the p-channel MOSFET M26. Also, $V_{PD0010}$ is the voltage difference between the wiring line 10 and the terminal of the capacitor Cn on the positive-side power supply (i.e., $V_{CC}$) when the MOSFET M26 is in the ON state.

If the sum of $C_{M20G}$, $C_{M23G}$, $C_{M23D}$, $C_{M24D}$, $C_{M25D}$, and $C_{M26D}$ is equal to 3 (pF), $V_{CLAMP2}$ is 0.5 (V), and $V_{PD0010}$ is 3 (V) (=$V_{CC}$), the capacitance value $C_n$ is given as 0.6 (pF) by the above equation (2).

The resistance value of the resistor R11 is determined to be high enough for the gate voltage $V_{G10}$ of the MOSFET M10 not becoming equal to or lower than the first clamp voltage $V_{CLAMP1}$. Moreover, the resistance value of the resistor R11 is so determined that the electric charges stored in the capacitor Cp can be approximately fully discharged through the resistor R11 and that the positive-side terminal of the capacitor Cp has a voltage approximately equal to the ground potential within the operation cycle time (e.g., 50 ns or less) of the output buffer circuit according to the first embodiment.

Similarly, the resistance value of the resistor R21 is determined to be high enough for the gate voltage $V_{G20}$ of the MOSFET M20 not becoming equal to or higher than the second clamp voltage $V_{CLAMP2}$. Moreover, the resistance value of the resistor R21 is so determined that the capacitor Cn can be approximately fully charged through the resistor R21 and that the negative-side terminal of the capacitor Cn has a voltage approximately equal to the power supply voltage of $V_{CC}$ within the operation cycle time (e.g., 50 ns or less) of the output buffer circuit according to the first embodiment.

Additionally, the penetrating currents of the first and second clamp circuit 1 and 2 are so determined as not to give bad effects to the operation of the other circuits connected to the same power supply of $V_{CC}$, such as sense amplifiers. By increasing the resistance values of the resistors R11 and R21, the penetrating currents can be decreased.

Next, the operation of the output buffer circuit according to the first embodiment shown in FIG. 2 is explained below with reference to FIGS. 3A to 3F.

Figure 3A:
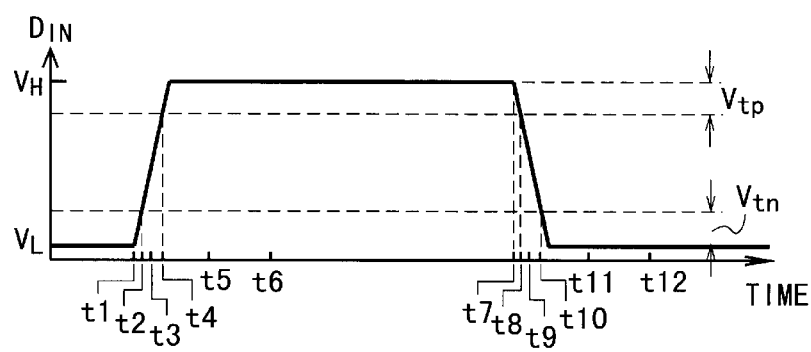
FIGS. 3A to 3F are timing diagrams showing the operation of the output buffer circuit according to the first embodiment of FIG. 2, respectively.
Figure 3B:
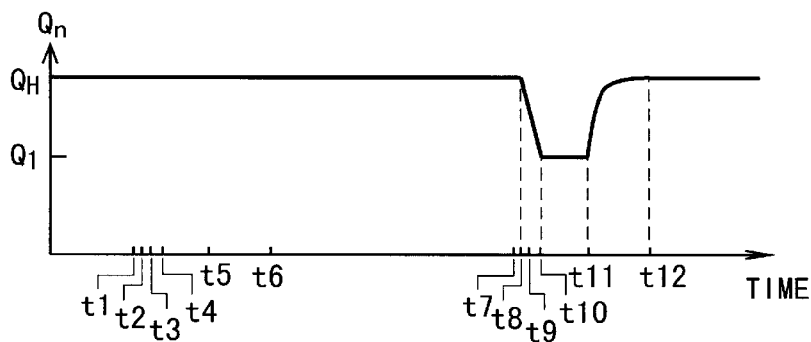
Figure 3C:
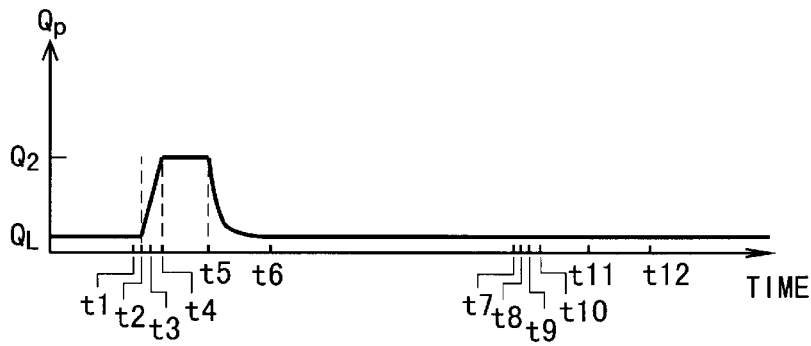

Prior to the time t1, the input signal $D_{IN}$ is in the logic L state, i.e., it has a logic L voltage of $V_L$, as shown in FIG. 3A. Thus, the output signal $D_{OUT}$ also is in the logic L state, i.e., it has a logic L voltage of $V_L$, as shown in FIG. 3F. The p-channel MOSFET M11 is in the ON state and the n-channel MOSFETs M15 and M17 are in the OFF state. Therefore, the first clamp circuit 1 and the first inverter 3 are inactive. On the other hand, the p-channel MOSFETs M25 and M27 are in the ON state and the n-channel MOSFET M21 is in the OFF state. Therefore, the second clamp circuit 2 is inactive and the second inverter 4 are active.

Then, the input signal $D_{IN}$ begins to rise from $V_L$ at the time t1 and then, it reaches the voltage of $(V_L + V_{tn})$ at the time t2, where $V_{tn}$ is the threshold voltage of an n-channel MOSFET. At this time t2, the n-channel MOSFET M15 is turned on, allowing a current to flow from the gate of the p-channel MOSFET M10 in the output stage 5 to the capacitor Cp through the MOSFET M15, which charges the capacitor Cp. As a result, as shown in FIG. 3C, the electric value Qp stored in the capacitor Cp begins to increase at the time t2. Due to this charging operation to the capacitor Cp, the gate voltage $V_{G10}$ of the MOSFET M10 begins to decrease rapidly from the logic-H voltage $V_H$, as shown in FIG. 3D.

As shown in FIG. 3F, the output signal $D_{OUT}$ has the logic-L voltage $V_L$ at the time t2. Therefore, the p-channel MOSFET M11 is in the ON state and the first clamp circuit 1 is turned to be active at the time t2. Since the n-channel MOSFET M17 is in the OFF state, the first inverter 3 is kept inactive at the time t2.

On the other hand, the input signal $V_{IN}$ reaches the voltage of $(V_L + V_{tn})$ at the time t2. Therefore, the n-channel MOSFET M21 is kept in the OFF state and the second clamp circuit 2 is kept inactive. Accordingly, the output of the second inverter 4 is applied to the gate of the n-channel MOSFET M20. Thus, as shown in FIG. 3E, at the time t2, the gate voltage $V_{G20}$ of the n-channel MOSFET M20 begins to decrease rapidly from the logic-H voltage $V_H$ toward the logic-L voltage $V_L$.

Figure 3D:
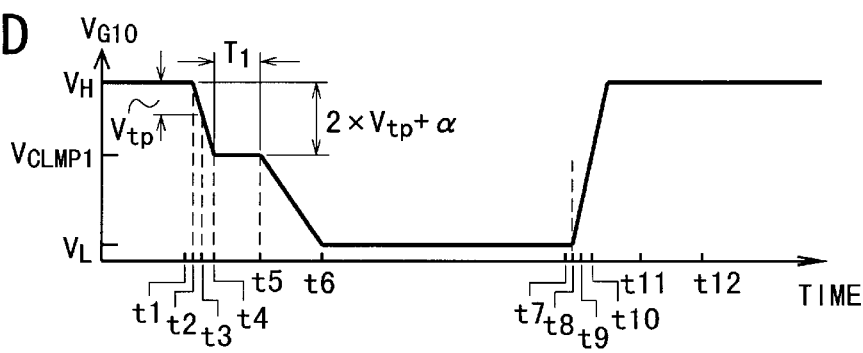
Figure 3E:
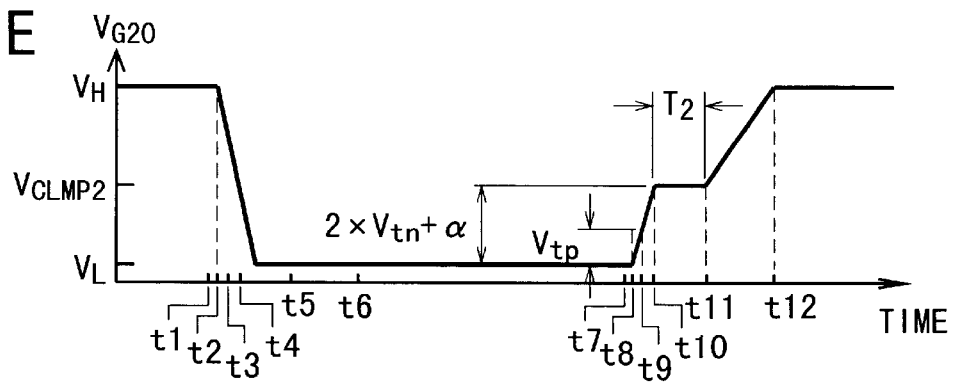
Figure 3F:
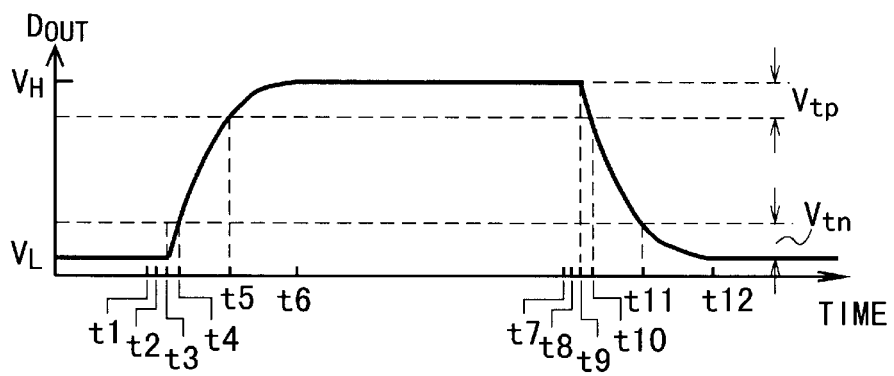

At the time t3, as shown in FIG. 3D, the gate voltage $V_{G10}$ of the MOSFET M10 reaches a level of $(V_H - V_{tp})$, where $V_{tp}$ is the threshold voltage of a p-channel MOSFET. Therefore, the p-channel MOSFET M10 is turned on and the output signal $D_{OUT}$ starts to increase, as shown in FIG. 3F.

At the time t4, as shown in FIG. 3D, the lowering gate voltage $V_{G10}$ of the p-channel MOSFET M10 becomes equal to the first clamp voltage $V_{CLAMP1}$. Then, the gate voltage $V_{G10}$ is clamped at $V_{CLAMP1}$ and at the same time, the charge $Q_p$ stored in the capacitor Cp is kept at $Q_2$.

At the time t4, as shown in FIG. 3F, the output signal $D_{OUT}$ reaches a level of $(V_L + V_{tn})$ and therefore, the n-channel MOSFET M17 is turned on. Thus, the first inverter 3 is turned to be active.

When the gate voltage $V_{G10}$ of the p-channel MOSFET M10 is kept at the first clamp voltage $V_{CLAMP1}$, a constant current flows through the MOSFET M10. Therefore, the output signal $D_{OUT}$ increases slowly, as shown in FIG. 3F.

On the other hand, at the time t4, the output signal $D_{OUT}$ reaches a level of $(V_L + V_{tn})$ and therefore, the n-channel MOSFET M21 is turned on. At the same time as this, since the input signal $D_{IN}$ reaches a level of $(V_H + V_{tp})$, the p-channel MOSFET M25 is turned off. Thus, the second clamp circuit 4 is kept inactive.

At the time t5, as shown in FIG. 3F, the output signal $D_{OUT}$ reaches a level of $(V_H - V_{tp})$ and therefore, the p-channel MOSFET M11 is turned off, inactivating the first clamp circuit 1. At this time, the first inverter 3 also is kept inactive. Thus, a current flows from the gate of the p-channel MOSFET M10 to the ground through the resistor R11. As a result, as shown in FIG. 3D, the gate voltage $V_{G10}$ of the MOSFET M10 decreases slowly during the period from the time t5 to the time t6. In response to the slow decrease of the gate voltage $V_{G10}$, the output signal $D_{OUT}$ starts to increase more slowly at the time t5.

Due to the turn-off operation of the p-channel MOSFET M11 at the time t5, the electric charges stored in the capacitor Cp start to be discharged. The current generated by this discharge operation flows to the ground through the resistor R11.

The operation of the output buffer circuit when the input signal $D_{IN}$ falls from $V_H$ to $V_L$ is opposite to that when the input signal $D_{IN}$ rises from $V_L$ to $V_H$.

Specifically, prior to the time t7, the input signal $D_{IN}$ has the logic H voltage $V_H$, as shown in FIG. 3A and the output signal $D_{OUT}$ has the logic H voltage $V_H$, as shown in FIG. 3F. The p-channel MOSFET M11 is in the OFF state and the n-channel MOSFETs M15 and M17 are in the ON state. Therefore, the first clamp circuit 1 is inactive and the first inverter 3 is active. On the other hand, the p-channel MOSFETs M25 and M27 are in the OFF state and the n-channel MOSFET M21 is in the ON state. Therefore, the second clamp circuit 2 and the second inverter 4 are inactive.

Then, the input signal $D_{IN}$ begins to lower from $V_H$ at the time t7 and then, it reaches the voltage of $(V_H-V_{tp})$ at the time t8. At this time t8, the p-channel MOSFET M25 is turned on, allowing a current to flow to the gate of the p-channel MOSFET M20 in the output stage 5 from the capacitor Cn through the MOSFET M25, which is discharged from the capacitor Cn. As a result, as shown in FIG. 3B, the electric value Qn stored in the capacitor Cn begins to decrease at the time t8. Due to this discharging operation from the capacitor Cn, the gate voltage $V_{G20}$ of the MOSFET M20 begins to increase rapidly from the logic-L voltage $V_L$, as shown in FIG. 3E.

As shown in FIG. 3F, the output signal $D_{OUT}$ has the logic-H voltage $V_H$ at the time t8. Therefore, the n-channel MOSFET M21 is in the ON state and the second clamp circuit 2 is active at the time t8. Since the p-channel MOSFET M27 is in the OFF state, the second inverter 4 is kept inactive.

On the other hand, since the input signal $V_{IN}$ reaches the voltage of $(V_H-V_{tp})$ at the time t8, the p-channel MOSFET M25 is turned on. At this time, the n-channel MOSFET M21 is kept in the ON state and therefore, the second clamp circuit 2 is kept active. Accordingly, the output of the second inverter 4 is applied to the gate of the p-channel MOSFET M20. Thus, as shown in FIG. 3E, at the time t8, the gate voltage $V_{G20}$ of the n-channel MOSFET M20 begins to increase rapidly from $V_L$ toward $V_H$.

At the time t9, as shown in FIG. 3D, the gate voltage $V_{G20}$ of the MOSFET M20 reaches a level of $(V_H-V_{tp})$. Thus, the n-channel MOSFET M20 is turned on and the output signal $D_{OUT}$ starts to decrease, as shown in FIG. 3F.

At the time t10, as shown in FIG. 3E, the gate voltage $V_{G20}$ of the n-channel MOSFET M20 becomes equal to the second clamp voltage $V_{CLAMP2}$. Then, the gate voltage $V_{G20}$ is clamped at $V_{CLAMP2}$ and at the same time, the charge $Q_n$ stored in the capacitor Cn is kept at $Q_1$.

At the time t10, as shown in FIG. 3F, the output signal $D_{OUT}$ reaches a level of $(V_L+V_{tn})$ and therefore, the p-channel MOSFET M27 is turned on. At the same time as this, since the input signal $D_{IN}$ reaches a level of $(V_L+V_{tn})$, the n-channel MOSFET M24 is turned off. Thus, the second inverter 4 is kept inactive.

When the gate voltage $V_{G20}$ of the p-channel MOSFET M20 is kept at the second clamp voltage $V_{CLAMP2}$, a constant current flows through the MOSFET M20. Therefore, the output signal $D_{OUT}$ decreases slowly, as shown in FIG. 3F.

On the other hand, at the time t11, the output signal $D_{OUT}$ reaches a level of $(V_L+V_{tn})$ and therefore, the p-channel MOSFET M11 is turned on. At the same time as this, since the input signal $D_{IN}$ reaches a level of $(V_H+V_{tp})$, the n-channel MOSFET M15 is turned off. Thus, the first clamp circuit 3 is kept inactive.

At the time t11, as shown in FIG. 3F, the output signal $D_{OUT}$ reaches a level of $(V_L+V_{tn})$ and therefore, the n-channel MOSFET M21 is turned off, inactivating the second clamp circuit 2. At this time, the second inverter 4 also is kept inactive. Thus, a current flows to the gate of the p-channel MOSFET M20 from the power supply through the resistor R21. As a result, as shown in FIG. 3D, the gate voltage $V_{G20}$ of the MOSFET M20 increases slowly during the period from the time t11 to the time t12. In response to the slow increase of the gate voltage $V_{G20}$, the output signal $D_{OUT}$ starts to decrease more slowly at the time t11.

Due to the turn-off of the n-channel MOSFET M21 at the time t11, capacitor Cn, into which the electric charges Qn have been stored, starts to be charged more. The current generated by this charge operation flows to the power supply through the resistor R21.

In FIGS. 3D and 3E, T1 and T2 denote the clamped periods of the gate voltages $V_{G10}$ and $V_{G20}$ of the p- and n-channel MOSFETs M10 and M20, respectively.

With the output buffer circuit according to the first embodiment, as explained above, the gate voltage $V_{G10}$ and $V_{G20}$ of the p- and n-channel MOSFETs M10 and M20 in the output stage 5 can be rapidly changed due to the charging or discharging operation of the capacitors Cp and Cn in response to the change of the input signal $D_{IN}$. As a result, a delay time of change of the output signal $D_{OUT}$ with respect to change of the input signal $D_{IN}$ can be decreased, which makes it possible to realize a higher-speed switching operation.

Moreover, since the switching operation of the p- and n-channel MOSFETs M10 and M20 in the output stage 5 are clamped by the first and second clamp circuits 1 and 2 during the specific periods T1 and T2, respectively, not only the penetrating currents flowing through the first and second claim circuits 1 and 2 but also the penetrating current through the MOSFETs M10 and M20 in the output stage 5 can be fixed at a low value. As a result, the peak current flowing through MOSFETs M10 and M20 in the output stage 5 can be decreased during their switching behaviors.

Additionally, the effect caused by the first and second clamp circuits 1 and 2 can be prevented from being applied to the operation of the output buffer circuit according to the first embodiment. This is because the currents flowing through the clamp circuits 1 and 2 can be suppressed and limited during the specific short periods T1 and T2.

Second Embodiment

Figure 4:
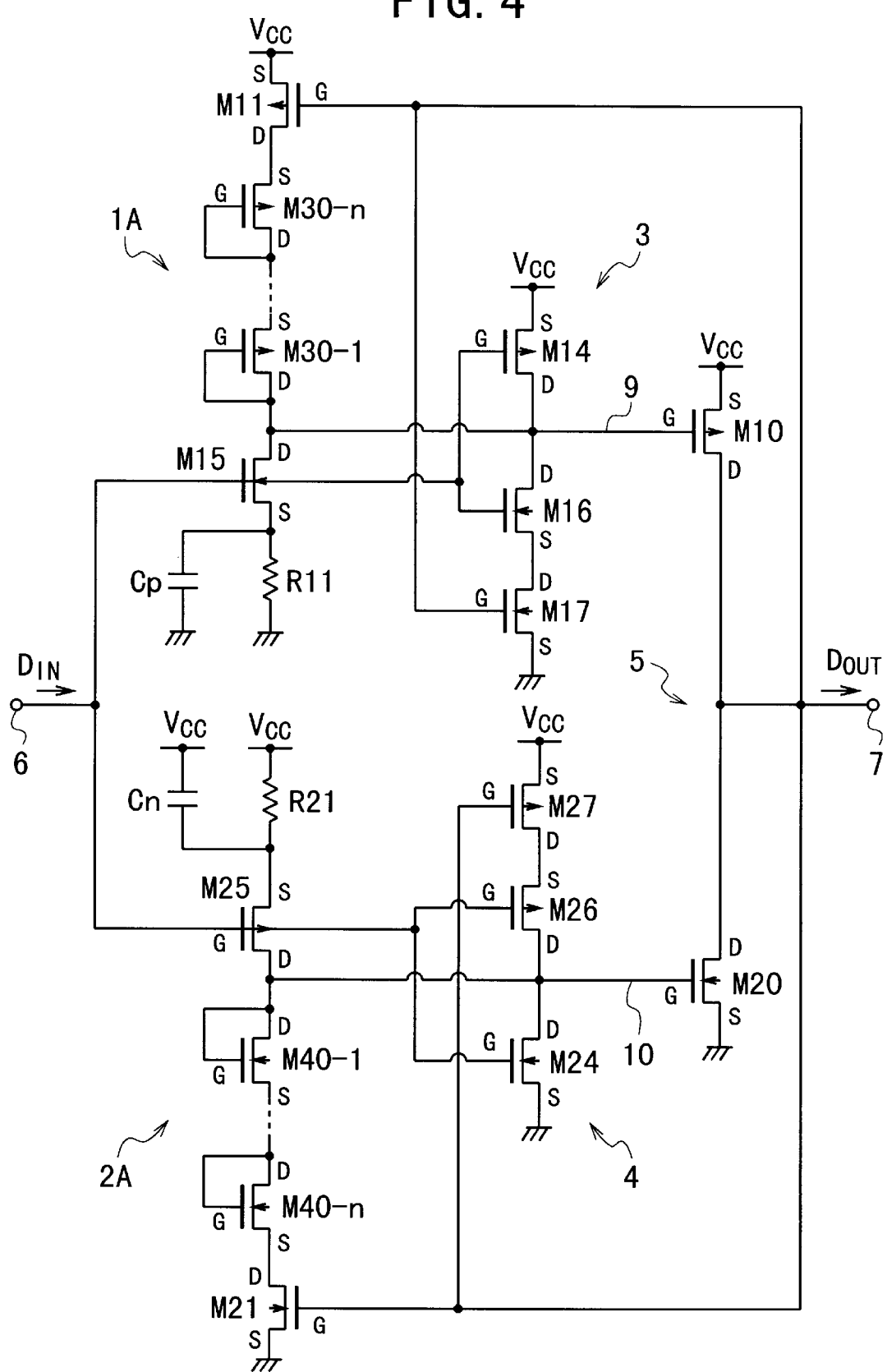
FIG. 4 is a circuit diagram showing the configuration of an output buffer circuit according to a second embodiment of the present invention.

FIG. 4 shows the configuration of an output buffer circuit according to a second embodiment of the present invention, which has the same configuration as that of the first embodiment except that a first clamp circuit 1A has serially-connected p-channel MOSFETs M30-1 to M30-n a second clamp circuit 2A has serially-connected n-channel MOSFETs M40-1 to M40-n, where n is an integer equal to unity or greater than two.

As seen from FIG. 4, the number of the serially-connected MOSFETs M30-1 to M30-n in the first clamp circuit 1A may be 1, 3 or more, and the number of the serially-connected MOSFETs M40-1 to M40-n in the second clamp circuit 2A may be 1, 3 or more.

The operation of the output buffer circuit according to the second embodiment is the same as that of the output buffer circuit according to the first embodiment.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. An output buffer circuit comprising:

an input terminal to which a digital input signal is applied;

an output terminal from which a digital output signal is derived according to said applied digital input signal;

a pair of a first p-channel MOSFET and a first n-channel MOSFET located in an output stage through which said output signal is derived;

a first clamp circuit controlled by said input and output signals for clamping a gate voltage of said first p-channel MOSFET at a first clamp level;

a second clamp circuit for clamping a gate voltage of said first n-channel MOSFET at a second clamp level;

a first resistor connected to said first clamp circuit for suppressing a current flowing through said first clamp circuit;

a second resistor connected to said second clamp circuit for suppressing a current flowing through said second clamp circuit;

a first capacitor connected to said first clamp circuit for adjusting said gate voltage of said first p-channel MOSFET through its charging or discharging operation; and a second capacitor connected to said second clamp circuit for adjusting said gate voltage of said first n-channel MOSFET through its charging or discharging operation;

wherein said first resistor and said first capacitor are connected in parallel for said first clamp circuit, and electric charges stored in said first capacitor are charged or discharge through said first resistor;

and wherein said second resistor and said second capacitor are connected in parallel for said second clamp circuit, and electric charges stored in said second capacitor are charged or discharged through said second resistor;

wherein said first clamp circuit clamps said gate voltage of said p-channel MOSFET at said first clamp level for a specific period, thereby increasing a rising rate of said output signal;

and wherein said second clamp circuit clamps said gate voltage of said first n-channel MOSFET at said second clamp level for a second specific period, thereby increasing a falling rate of said output signal.

2. The circuit as claimed in claim 1, wherein said first clamp circuit includes a first switch operated by said input signal and a second switch operated by said output signal, and said second clamp circuit includes a third switch operated by said input signal and a fourth switch operated by said output voltage;

and wherein said first and second switches serve to activate or inactivate said first clamp circuit, and said third and fourth switches serve to activate or inactivate said second clamp circuit.

3. The circuit as claimed in claim 1, wherein said first clamp circuit includes a second p-channel MOSFET and a third p-channel MOSFET connected in series, and said second clamp circuit includes a second n-channel MOSFET and a third n-channel MOSFET connected in series.

4. The circuit as claimed in claim 1, further comprising a first inverter and a second inverter;

wherein said first inverter serves to invert said input signal to output an inverted signal to said gate of said first p-channel MOSFET;

and wherein said second inverter serves to invert said input signal to output an inverted signal to said gate of said first n-channel MOSFET.

5. An output buffer circuit comprising:

an input terminal to which a digital input signal is applied;

an output terminal from which a digital output signal is derived according to said applied digital input signal;

a pair of a first p-channel MOSFET and a first n-channel MOSFET located in an output stage through which said output signal is derived;

a first clamp circuit controlled by said input and output signals for clamping a gate voltage of said first p-channel MOSFET at a first clamp level;

a second clamp circuit for clamping a gate voltage of said first n-channel MOSFET at a second clamp level;

a first resistor connected to said first clamp circuit for suppressing a current flowing through said first clamp circuit;

a second resistor connected to said second clamp circuit for suppressing a current flowing through said second clamp circuit;

a first capacitor connected to said first clamp circuit for adjusting said gate voltage of said first p-channel MOSFET through its charging or discharging operation;

a second capacitor connected to said second clamp circuit for adjusting said gate voltage of said first n-channel MOSFET through its charging or discharging operation;

wherein said first clamp circuit includes a first switch operated by said input signal and a second switch operated by said output voltage, and said second clamp circuit includes a third switch operated by said input signal and a fourth switch operated by said output signal, wherein said first and second switches serve to activate or inactivate said first clamp circuit, and said third and fourth switches serve to activate or inactivate said second clamp circuit, respectively, and wherein said first clamp circuit clamps said gate voltage of said first p-channel MOSFET at said first clamp level for a first specific period, thereby increasing a rising rate of said output signal, and said second clamp circuit clamps said gate voltage of said first n-channel MOSFET at said second clamp level for a second specific period, thereby increasing a falling rate of said output signal.

6. The circuit as claimed in claim 5, wherein said first clamp circuit includes a second p-channel MOSFET and a third p-channel MOSFET connected in series, and said second clamp circuit includes a second n-channel MOSFET and a third n-channel MOSFET connected in series.

7. The circuit as claimed in claim 5, further comprising a first inverter and a second inverter;

wherein said first inverter serves to invert said input signal to output an inverted signal to said gate of said first p-channel MOSFET;

and wherein said second inverter serves to invert said input signal to output an inverted signal to said gate of said first n-channel MOSFET.

8. An output buffer circuit comprising:

an input terminal to which a digital input signal is applied;

an output terminal from which a digital output signal is derived according to said applied digital input signal;

a pair of a first p-channel MOSFET and a first n-channel MOSFET located in an output stage through which said output signal is derived;

a first clamp circuit controlled by said input and output signals for clamping a gate voltage of said first p-channel MOSFET at a first clamp level;

a second clamp circuit for clamping a gate voltage of said first n-channel MOSFET at a second clamp level;

a first resistor connected to said first clamp circuit for suppressing a current flowing through said first clamp circuit;

a second resistor connected to said second clamp circuit for suppressing a current flowing through said second clamp circuit;

a first capacitor connected to said first clamp circuit for adjusting said gate voltage of said first p-channel MOSFET through its charging or discharging operation;

a second capacitor connected to said second clamp circuit for adjusting said gate voltage of said first n-channel MOSFET through its charging or discharging operation;

wherein said first clamp circuit includes a first switch operated by said input voltage and a second switch operated by said output voltage, and said second clamp circuit includes a third switch operated by said input voltage and a fourth switch operated by said output voltage, wherein said first and second switches serve to activate or inactivate said first clamp circuit, and said third and fourth switches serve to activate or inactivate said second clamp circuit, wherein said first clamp circuit clamps said gate voltage of said first p-channel MOSFET at said first clamp level for a first specific period, thereby increasing a rising rate of said output signal, and said second clamp circuit clamps said gate voltage of said first n-channel MOSFET at said second clamp level for a second specific period, thereby increasing a falling rate of said output signal; and wherein said first inverter serves to invert said input signal to output an inverted signal to said gate of said first p-channel MOSFET, and said second inverter serves to invert said input signal to output an inverted signal to said gate of said first n-channel MOSFET.

9. The circuit as claimed in claim 8, wherein said first clamp circuit includes a second p-channel MOSFET and a third p-channel MOSFET connected in series, and said second clamp circuit includes a second n-channel MOSFET and a third n-channel MOSFET connected in series.

* * * * *

UNITED STATES PATENT AND TRADEMARK OFFICE
CERTIFICATE OF CORRECTION

PATENT NO.    : 6,236,248 B1
DATED         : May 22, 2001
INVENTOR(S)   : Koga, Hiroki It is certified that error appears in the above-identified patent and that said Letters Patent is hereby corrected as shown below:

<u>Title page,</u>
Item 75, "Kangawa" should be -- Kanagawa --.

<u>Column 15,</u>
Line 56, "voltage" should be -- signal --.

<u>Column 16,</u>
Line 37, "voltage" should be -- signal --.

<u>Column 17,</u>
Line 27, "voltage" should be -- signal --.

<u>Column 18,</u>
Lines 1, 3 and 4, "voltage" should be -- signal --.

Signed and Sealed this

Sixth Day of April, 2004

JON W. DUDAS
*Acting Director of the United States Patent and Trademark Office*